United States Patent [19]

Metzger

[11] Patent Number: 5,427,894
[45] Date of Patent: Jun. 27, 1995

[54] PROCESS FOR PREPARING IMAGES ON TONABLE, LIGHT-SENSITIVE LAYERS

[75] Inventor: Bernhard Metzger, Darmstadt, Germany

[73] Assignee: E. I. Du Pont de Nemours and Company, Wilmington, Del.

[21] Appl. No.: 897,712

[22] Filed: Jun. 12, 1992

[30] Foreign Application Priority Data

Jun. 24, 1991 [DE] Germany .................. 41 20 793.9

[51] Int. Cl.$^6$ .................................................. G03C 3/00
[52] U.S. Cl. ........................................ 430/291; 430/252; 430/253; 430/256; 430/260; 430/292; 430/293
[58] Field of Search ............... 430/293, 291, 292, 256, 430/253, 252, 260

[56] References Cited

U.S. PATENT DOCUMENTS

| | | | |
|---|---|---|---|
| 3,060,024 | 10/1962 | Burg et al. | 96/28 |
| 3,060,025 | 10/1962 | Burg et al. | 96/28 |
| 3,582,327 | 6/1971 | Boyd et al. | 96/28 |
| 3,620,726 | 11/1971 | Chu et al. | 96/27 |
| 3,649,268 | 3/1972 | Chu et al. | 96/27 |
| 4,243,741 | 1/1981 | Abele et al. | 430/270 |
| 4,275,140 | 6/1981 | Neiss | 430/254 |
| 4,346,162 | 8/1982 | Abele | 430/270 |
| 4,356,253 | 10/1982 | Buzzell | 430/291 |
| 4,604,340 | 8/1986 | Grossa | 430/270 |
| 4,806,451 | 2/1989 | Frohlich | 430/291 |
| 4,892,802 | 1/1990 | Bauer | 430/270 |
| 4,902,363 | 2/1990 | Delaney et al. | 156/230 |
| 4,935,331 | 6/1990 | Platzer et al. | 430/254 |
| 5,126,226 | 6/1992 | Frohlich et al. | 430/257 |

*Primary Examiner*—Paul R. Michl
*Assistant Examiner*—P. Hampton-Hightower

[57] ABSTRACT

A process for preparing images on tonable, light-sensitive layers using a transfer material comprising (a) a support, (b) a transfer layer containing in its binder a finely divided powder or a finely divided powder and a dissolved dye, and (c) a cover layer containing a binder and/or discrete, inert particles is described. Such transfer materials can be used to make color proof prints having high resolution, reproducible color density, low dot growth, and no troublesome background fog.

25 Claims, No Drawings

PROCESS FOR PREPARING IMAGES ON TONABLE, LIGHT-SENSITIVE LAYERS

FIELD OF THE INVENTION

This invention concerns a process for preparing images on tonable, light-sensitive layers. More particularly this invention concerns a color proofing process in which an image is toned using a transfer material comprising (a) a support, and a transfer layer provided thereon, said transfer layer containing a binder and a finely divided powder or a finely divided powder and a dissolved dye, and (b) a cover layer present on the surface of the transfer layer away from the support.

BACKGROUND OF THE INVENTION

In reprography, halftone color separations are used, as is known, as copy originals for making offset or letterpress printing plates. Before the printing plates are exposed, the color separations are proofed for this purpose with the aid of color proofing processes to determine whether the ultimate printing result will be a correct tonal value reproduction of the original.

Widely used, standard specifications, for example, for a high quality offset print, require a resolution of 2%–98% dots in modern printing machines, and 1%–99% dots at a screen count of 60 lines/cm. At this line count, it is especially difficult to achieve satisfactory resolution of the pointy 2% dots in the highlights and the 98% dots in the shadows. Moreover, for good tonal reproduction, it is of considerable significance for halftone dots of the same size to be sharply defined over the entire surface area and to be reproduced uniformly, that is, without variations in size.

Such color proofing processes use light-sensitive recording materials that produce an image by the difference in tackiness between the exposed and unexposed areas of the light-sensitive layer. Thus, for example, German Patents 12 10 321 (Burg, U.S. Pat. No. 3,060,024), 19 04 058 (Chu, U.S. Pat. No. 3,620,726), 19 04 059 (Boyd, U.S. Pat. No. 3,582,327), and 20 04 214 (Chu, U.S. Pat. No. 3,649,268), Buzzell, U.S. Pat. No. 4,356,253, and EP-A 02 43 933 (Bauer, U.S. Pat. No. 4,892,802) disclose a reproduction process in which a tacky photopolymerizable recording material comprising a support and a photopolymerizable layer containing at least one addition-polymerizable monomer and a photopolymerization initiator is hardened by imagewise exposure so that the exposed image areas lose their tackiness. The latent image is then rendered visible by the application of a suitable toner that adheres only to the unexposed, tacky areas. Toner remaining on the exposed, non-tacky image areas can be removed after application. This process yields positive, optionally colored, images of the original, and these images resemble in appearance, images produced by color printing.

Similarly, negative images of the original are obtained by using the light-sensitive materials described, for example, in German Patents 27 58 209 (Abele, U.S. Pat. No. 4,243,741), 30 23 247 (Abele, U.S. Pat. No. 4,346,162), and 34 29 615 (Grossa, U.S. Pat. No. 4,604,340). The light-sensitive component of these recording materials is either a dihydropyridine compound or a system of a dihydropyridine compound and a hexaaryl bis-imidazole compound.

Toners comprising predominantly finely divided powders can be applied by dusting the toner on the imagewise exposed surface. Alternatively, the toner can be loosely bonded to a special support and transferred by bringing the support into contact with the imagewise exposed layer.

Such transfer layers are substantially more advantageous, because they are (a) significantly simple to handle, (b) cleaner, and (c) environmentally safer. Pigmented transfer layers are described, for example, in German Patents 12 05 117 (Burg, U.S. Pat. No. 3,060,025) and 29 49 462 (Neiss, U.S. Pat. No. 4,275,140). These transfer layers are undesirable because they do not satisfy the stringent requirements of color proofing processes. DE-C 36 25 014 (Fröhlich, U.S. Pat. No. 4,806,451), DE-C 37 06 528 (Delaney, U.S. Pat. No. 4,902,363), DE-C 39 41 446 (U.S. Pat. No. 5,126,226), DE-C 39 41 493, and EP-A 03 65 361 (Platzer, U.S. Pat. No. 4,935,331) describe color proofing processes using transfer layers specifically developed to meet the needs of the printing industry.

Although these known processes can indeed fulfill the most important requirements of the printing industry, e.g., high resolution, good tonal value reproduction, and low dot growth, the problem of background fog or stain has not yet been solved. This defect depends on the greater or lesser transfer of the color pigments of the transfer layer onto the non-tacky areas of the recording materials, i.e., areas that actually should not be toned. Background stain occurs particularly when the light-sensitive recording material does not show good differentiation in the tackiness of exposed and unexposed areas. Background fog or stain is also very pronounced in many of the colored transfer layers, particularly if the transfer layer components are not optimally coordinated with each other. Background stain can in fact be prevented by modifying the process requirements in manufacturing and/or processing, that is, in laminating the transfer layer onto the recording material. However, this demands special, technically expensive and time-consuming measures for each individual material.

There is a need for a proofing process that (a) can attain the high resolution of 1%–99% dots required by the printing industry, (b) is outstanding for high uniformity of halftone values overall and for very low dot growth, (c) can be used for different tonable, light-sensitive layers, and (d) produces color proof prints without background stain.

Accordingly, these needs are met using the process of the invention.

SUMMARY OF THE INVENTION

The invention describes a process for preparing images comprising:

a) imagewise exposing a light-sensitive layer to produce tacky and non-tacky areas;

b) contacting the exposed layer with a light insensitive transfer layer on a support, said transfer layer having at least one finely divided powder or at least one finely divided powder and at least one dissolved dye; and c) separating the exposed layer from the transfer layer so that the transfer layer adheres only to the tacky image areas;

wherein the transfer layer has a cover layer on its surface away from the support.

DETAILED DESCRIPTION OF THE INVENTION

The use of transfer materials comprising a support, a transfer layer, and a cover layer in color proofing processes requiring high resolution, reproducible color density, and low dot growth is contraindicated in that an additional cover layer might prevent adequate contact between the colored transfer layer and the tacky, tonable areas of the light-sensitive layer. Inadequate contact would result in insufficient color transfer, which would then lead to defects in the final image. Poor contact is particularly disadvantageous in the pointy 1–2% dots, because entire dots can fail in this range.

Surprisingly and unexpectedly, it was found that the transfer materials used in the process of the invention yield color proof prints of outstanding quality without defects in the image areas.

Compared to conventional materials, the transfer materials used in the process of the invention are especially advantageous in that color proof prints prepared therefrom do not show troublesome background stain. Background stain is determined by means of the color value difference, i.e., $\Delta E$, between non-image areas that are covered during the toning step and those non-image areas that are in contact with the transfer layer during the toning process. Prior art materials attain mostly $\Delta E$ values of 0.5–0.7, which correspond to unacceptable background stain. A $\Delta E$ value of 0.45 is the highest limit possible. However, a preferred $\Delta E$ value should be below 0.3. The transfer materials used in the process of the invention, have $\Delta E$ values of about 0.2. In addition, the process for preparing the new transfer materials is simple despite the additional process step of applying the cover coating. The transfer materials also yield products of constant, high quality. Another advantage of the process of the invention is that no special requirements are imposed on the tonable recording materials, particularly with respect to the difference in tackiness between exposed and unexposed areas. Thus, the new transfer material can be combined with many tonable, light-sensitive materials.

Moreover, specially trained personnel are not necessary to carry out the transfer process of the invention, inasmuch as expensive coordination of all process parameters with the tonable and/or colored transfer materials used in each instance can be omitted. In addition, color proof prints of outstanding quality are obtained under less than optimum processing conditions.

The light-sensitive material used in the process of the invention can comprise positive as well as negative, tonable systems. These systems are described in DE-C 12 10 321 (Burg, U.S. Pat. No. 3,060,024), DE-C 19 04 058 (Chu, U.S. Pat. No. 3,620,726), DE-C 19 04 059 (Boyd, U.S. Pat. No. 3,582,327), DE-C 20 04 214 (Chu, U.S. Pat. No. 3,649,268), or DE-C 27 58 209 (Abele, U.S. Pat. No. 4,243,741), DE-C 30 23 247 (Abele, U.S. Pat. No. 4,346,162), and DE-B 34 29 615 (Grossa, U.S. Pat. No. 4,604,340), respectively. Positive, light-sensitive materials, such as those described, for example, in Buzzell, U.S. Pat. No. 4,356,253 and EP-A 02 43 933 (Bauer, U.S. Pat. No. 4,892,802), are preferred.

The cover layer essential to the invention contains at least one binder and/or discrete, inert particles. A rough cover layer is preferred. In particular, rough cover layers composed essentially of discrete, inert particles, preferably colorless, are suitable. These particles have preferably a diameter of less than or equal to 15 microns. Particles having a diameter of less than or equal to 5 microns are especially preferred.

The particles of the rough cover layer comprise inorganic as well as organic materials. Suitable materials are silicon dioxide, zinc oxide, titanium oxide, zirconium oxide, aluminum oxide, starch, phenol resins, or homopolymers and copolymers of styrenes, vinyl alcohols, vinyl acetates, acrylic acid and methacrylic acid or their derivatives, and tetrafluoroethylene. Homopolymers and copolymers of unsaturated hydrocarbons, such as ethylene and propylene, are particularly suitable.

The coating quantity of the discrete, inert particles essential to the invention is preferably 0.5–5000 particles/mm$^2$. A coating quantity of 10–500 particles/mm$^2$, particularly 50–200 particles/mm$^2$, is especially preferred. The rough cover layer used in the process of the invention can also contain an appropriate binder, preferably not more than 80% by weight, in particular 30–70% by weight being especially preferred. Appropriate binders are, for example, the binders described in DE-C 36 25 014 (Fröhlich, U.S. Pat. No. 4,806,451), DE-C 39 41 446 (U.S. Pat. No. 5,126,226), or DE-C 39 41 493 for colored transfer materials. Especially appropriate are polymers with a tensile strength of greater than or equal to 2 N/mm$^2$, as described in DE-C 39 41 493. However, cover layers without a binder are preferred. The material forming the cover layer can be applied onto the colored transfer layer by various methods. The cover layer can be applied, for example, by dusting on fine powder or by casting, roller coating or spraying powder dispersions in suitable solvents. Additives, such as, for example, surfactants, coating auxiliaries, etc., can be used. After drying, the materials thus prepared can be processed immediately.

All known materials can be used as the colored transfer layer, such as, for example, the layers described in DE-C 36 25 014 (Fröhlich, U.S. Pat. No. 4,806,451), DE-C 39 41 446 (U.S. Pat. No. 5,126,226), DE-C 39 41 493, and EP-A 03 65 361 (Platzer, U.S. Pat. No. 4,935,331). Particularly suitable are the materials disclosed in DE-C 39 41 493, which have a polymeric binder having a tensile strength of greater than or equal to 2 N/mm$^2$, preferably between 2 and 110 N/mm$^2$. Especially suitable are polymers having a tensile strength between 5 and 60 N/mm$^2$. Examples of these polymers are homopolymers and copolymers of ethylene, propylene, vinyl esters, vinyl chloride, acrylates, methacrylates and acrylamides or methacrylamides, and cellulose derivatives. Polymers soluble in organic solvents are particularly suitable. Copolymers of vinyl acetate and ethylene and polymethyl methacrylates or polystyrenes are outstandingly suitable.

The transfer layer should contain greater than or equal to 20% by weight, preferably 30–70% by weight, of a finely divided powder or the combination of finely divided powder with dissolved dye.

Transfer materials containing binder and finely divided powder, for example, a pigment, in approximately equal quantities are particularly preferred.

Many finely divided powders suitable for image recording are disclosed in the literature, for example, DE-C 19 04 059 (Boyd, U.S. Pat. No. 3,582,327) and DE-C 29 46 896 (Manger, U.S. Pat. No. 4,215,193). These powders are predominantly pigments, but dissolved dyes combined with a finely divided powder can also be used. Examples are inorganic and organic pigments, fluorescent material, metal powders in pure form or together with a powdered organic or inorganic support, such as titanium oxide, glass powder, carbon (carbon black or graphite), metal phthalocyanines, azo dyes, metal powders of aluminum, copper, iron, gold, or silver, or metallic oxides. The use of a mixture of pigment and silicon dioxide is particularly advantageous. The coating compositions are prepared by known methods.

The coating composition for the transfer layer is applied by known methods onto a suitable support and then dried. The coating composition is a pigment/binder mixture which is coated onto the support preferably from organic solvents. Suitable supports are particularly paper and synthetic resin sheets of polyesters, polyamides, polyethylene, polypropylene, polyvinyl chloride, and the like. Compressible materials, such as those described in DE-C 37 06 528 (Delaney, U.S. Pat. No. 4,902,363), are especially advantageous.

The dried coating can be up to 8 microns thick, and preferably up to 5 microns. Very thin coatings, less than 3 microns thick, preferably 0.4–1.5 microns thick, are especially preferred.

In addition, the coating composition can contain other additives, such as surfactants, coating auxiliaries, lubricants, agents to increase viscosity, agents to control adhesion, and the like.

The process of the invention can be used advantageously to reproduce line and halftone exposures for application in the graphic and other industrial fields, for preparing maps, advertising, posters, illuminated letter text, and for making printed circuits. However, the main field of use is in the preparation of monochromatic or polychromatic images and in color proofing processes.

Performing a color proofing process in accordance with the subject invention includes the following process steps:

The light-sensitive material, for example, a laminate of a coversheet and a photopolymerizable layer coated on a support sheet and with a coversheet is placed, after removal of the coversheet, onto an image receptor material. The laminate is exposed by actinic radiation through the transparent support to a positive or negative, depending on whether a positive or negative working system is involved, halftone color separation of a first color as the original to form tacky and non-tacky areas.

The light-sensitive materials have their maximum sensitivity in the ultraviolet range, preferably in the wavelength range between 250 and 450 nm. Suitable radiation sources for exposure are all those producing an effective amount of this radiation, such as for example, xenon lamps, mercury vapor lamps, carbon arc lamps, lasers, fluorescent lamps emitting UV radiation, and electronic flash devices.

The support is removed from the transfer material used in the process of the invention, and the transfer layer with the cover layer is laminated onto the exposed layer and then stripped off. A color image of the original is obtained. A second laminate of the light-sensitive material is laminated onto the image after removal of the coversheet, and exposed under the same conditions to a negative or positive halftone color separation of a second color as the original. The exposed layer is then toned with the transfer material by laminating the transfer layer along with the cover layer onto the exposed layer. The transfer layer is then removed by stripping it off the cover layer.

This procedure is repeated for a color separation of a third color and, if desired, for a black separation. Thus, a four-colored image corresponding to the originals is obtained.

Industrial Applicability

A particular advantage of the process of the invention is that, starting from a positive-working, light-sensitive system, four-color overlays and from these, a positive color proof print is produced. A positive color proof can also be prepared with negative color separations as originals. If negative color separations are used as starting originals, a proof print is prepared first by the above-described method. The residual images remaining on the transfer layers used to transfer the individual colors are then laminated one upon another to prepare the proof print from the tacky intermediate coatings by using pressure and/or heat and subsequently stripping off the support.

Alternatively, it is also possible to place the residual images remaining on the transfer layers one upon another as an overlay.

EXAMPLES

The following examples illustrate the invention. Unless otherwise stated, parts and percentages are by weight.

Example 1

The coating composition for the transfer layer used in the process of the invention was prepared as follows: 3.34 g ethylene/vinyl acetate copolymer (40% vinyl acetate, tensile strength 5.3 N/mm$^2$ by ASTM D-882), 8.83 g nitrocellulose (nitrogen content less than 12.6%), 4.3 g cyan pigment based on copper phthalocyanine (C.I. 74160), and 0.2 surfactant were milled with half of a solvent mixture of toluene, 2-butanone, and xylene (60:35:5, total 83.3 g) in a bead mill. The rest of the solvent was then added with vigorous stirring. The coating composition was applied onto a 60 micron thick polypropylene foam sheet as in DE-OS 37 06 528 (Delaney, U.S. Pat. No. 4,902,363) and after drying, produced a 0.45 micron-thick coating. A 20% dispersion of a polyethylene wax (particle size less than or equal to 1 micron) in xylene was coated on the dried transfer coating. The coating quantity was 100–200 particles/mm$^2$.

A colored image was prepared as follows: A positive, tonable, photopolymerizable element prepared according to Example 1 of EP-A 02 43 933 (Bauer, U.S. Pat. No. 4,892,802) was laminated, after removal of the coversheet, onto an image receptor material. The laminate was exposed for 42 sec through a halftone cyan color separation in a vacuum copy frame with a metal halogen lamp (3000 watts) using a UV filter at a spacing of 95 cm. After removal of the support, the transfer material containing the toner was laminated onto the imagewise exposed coating and immediately stripped off. The transfer layer remained only on the unexposed, tacky areas, and a positive cyan image of the original was obtained with a resolution of 1%–99% halftone dots on the 60 lines/cm screen. To determine background stain, a portion of the image areas not to be toned was covered with a polyester sheet before the toning step.

The color value difference ΔE between the covered and non-covered areas was measured according to DIN 5033. The ΔE was approximately 0.2 and the image showed no troublesome background stain.

Example 2

A 0.45 micron thick transfer layer without a cover layer was prepared as in Example 1 and processed. Background stain was too high (ΔE=0.6) with the transfer materials not in accordance with the invention and used in this example.

Example 3

Transfer materials for the colors (a) cyan, (b) magenta, (c) yellow,, and (d) black, required for making a four-color image, were prepared by milling in a bead mill the quantities of pigment, binder, and surfactant provided in Table 1 with 40–60% of the total required solvent mixture of toluene, 2-butanone, and xylene (6:3:1). The rest of the solvent was then added with vigorous stirring.

TABLE 1

| | CYAN (g) | MAGENTA (g) | YELLOW (g) | BLACK (g) |
|---|---|---|---|---|
| Pigment | 52.50 | 80 | 35.0 | 50 |
| Amorphous $SiO_2$ | 15.00 | 50 | 8.0 | 40 |
| Ethylene/vinyl acetate copolymer, 18% vinyl acetate, tensile strength: 5.9 $N/mm^2$ by ASTM D-882 | 80.55 | 116.75 | 56.0 | 107.4 |
| Anionic surfactant | 1.95 | 3.25 | 1.0 | 2.6 |
| Solvent | 850.0 | 750.0 | 900.0 | 800.0 |

The pigments used in each transfer material were:

(a) a mixture of a cyan pigment based on copper phthalocyanine (C.I. 74160) and a magenta pigment (C.I. Pigment Red 123) for the cyan transfer coating (a);

(b) a mixture of two magenta pigments (C.I. Red 122 and Pigment Red 123) for the magenta transfer coating (b);

(c) C.I. Pigment Yellow 117 for the yellow transfer coating (c); and (d) C.I. Pigment Black 7 for the black transfer coating (d).

The coating composition for each transfer material was applied to a 60 micron thick polypropylene foam sheet as in DE-OS 37 06 528 (Delaney, U.S. Pat. No. 4,902,363) with an 80 lines/cm screen by direct gravure printing at a printing speed of 150 m/min. After the coating was dried, a 20% dispersion of a polyethylene wax (particle size less than or equal to 1 micron) in xylene was coated on the 1 micron thick layer. The coating quantity was 100–200 particles/$mm^2$. The color density of the individual coatings was:

| | |
|---|---|
| Cyan: | 1.30 |
| Magenta: | 1.40 |
| Yellow: | 1.30 |
| Black: | 1.70 |

To prepare a four-color proof print, a positive, tonable, photopolymerizable element prepared according to Example 1 of EP-A 02 43 933 (Bauer, U.S. Pat. No. 4,892,802) was laminated, after removal of the coversheet, onto an image receptor material. The resulting laminate was exposed for 42 sec through a cyan halftone, positive color separation in a vacuum copy frame with a metal halogen lamp (3000 watts) using an ultraviolet filter at a spacing of 95 cm. After removal of the support, transfer material (a) was laminated onto the imagewise exposed layer and immediately stripped off. The transfer layer adhered only to the unexposed, tacky areas and a positive cyan image of the original was obtained without troublesome background stain.

A second positive, tonable, photopolymerizable recording material was laminated on the cyan image and exposed as above through the corresponding magenta halftone separation. After removal of the support, transfer material (b) was laminated onto the imagewise exposed layer and then stripped off. The transfer layer adhered only to the unexposed, tacky areas, and a positive magenta image was obtained without troublesome background stain. Analogous process steps were repeated for yellow and black using transfer materials (c) and (d) respectively. A protective coating was then applied in the usual manner. A four-color proof print of outstanding brilliance and sharpness was obtained with a resolution of 1%–99% in the 60 lines/cm screen, representing a true-to-life reproduction of the original. In all four colors, dot growth was around 19% in the middle tones. The proof print showed no troublesome background stain (ΔE, about 0.2).

What is claimed is:

1. A process for preparing an image comprising:
   a) imagewise exposing a tonable light-sensitive layer to produce tacky and non-tacky areas;
   b) contacting the exposed layer with a light insensitive transfer layer on a support, said transfer layer having at least one finely divided powder or at least one finely divided powder and at least one dissolved dye; and
   c) separating the exposed layer from the transfer layer; wherein the transfer layer has a cover layer on its surface away from the support.

2. A process for preparing multicolor images comprising:
   a) applying onto a support, a tonable light-sensitive layer in which tacky and non-tacky areas can be produced by imagewise exposure;
   b) exposing the light-sensitive layer imagewise;
   c) contacting the exposed layer with a light insensitive transfer layer on a support, said transfer layer having at least one finely divided powder, or at least one finely divided powder and at least one dissolved dye; and said transfer layer has a cover layer on its surface away from the support;
   d) removing the support with the non-adhering areas of the transfer layer, and
   (e) repeating steps a)–d) whereby in step a), each new light sensitive layer is applied onto the light-sensitive layer treated according to the preceding steps.

3. The process of claim 1 or 2, wherein the cover layer is rough.

4. The process of claim 3 wherein the rough cover layer consists essentially of discrete, inert particles.

5. The process of claim 4 wherein the discrete, inert particles have a diameter of less than or equal to 15 microns.

6. The process of claim 4 wherein the discrete, inert particles are present in the amount of 0.5–5000 particles/$mm^2$.

7. The process of claim 4, wherein the discrete, inert particles are selected from the group consisting of $SiO_2$, $Al_2O_3$, zinc oxide, titanium oxide, zirconium oxide, starch, phenolresins, homopolymers and/or copolymers of unsaturated hydrocarbons, homopolymers and copolymers of styrene, vinyl alcohols, vinyl acetates, acrylic acid, or methacrylic acid and tetrafluoroethylene.

8. The process of claim 1 or 2, wherein the cover layer contains less than or equal to 80% by weight of a polymer having a tensile strength greater than or equal to 2 N/mm$^2$.

9. The process of claim 1 or 2 wherein the transfer layer contains 30–70 percent by weight of a finely divided powder or the combination of a finely divided powder with a dissolved dye.

10. The process of claim 9 wherein the transfer layer contains at least one polymer having a tensile strength of greater than or equal to 2 N/mm$^2$.

11. The process of claim 1 or 2 wherein the support is a compressible material.

12. The process of claim 1 or 2 wherein the tonable, light-sensitive layer is a photopolymerizable layer containing (a) at least one photopolymerizable monomer, (b) a photoinitiator system, and (c) a binder or mixture of binders.

13. A transfer material comprising:
    (a) a support;
    (b) a transfer layer present on the surface of said support, said transfer layer comprising a binder and at least one finely divided powder or at least one finely divided powder and at least one dissolved dye; and
    (c) a cover layer present on the surface of said transfer layer opposite said support.

14. The transfer material of claim 13 wherein the cover layer is rough.

15. The transfer material of claim 14 wherein the rough cover layer consists essentially of discrete, inert particles.

16. The transfer material of claim 15 wherein the discrete, inert particles are selected from the group consisting of SiO$_2$, Al$_2$O$_3$, zinc oxide, titanium oxide, zirconium oxide, starch, phenol resins, homopolymers and/or copolymers of unsaturated hydrocarbons, homopolymers and copolymers of styrene, vinyl alcohols, vinyl acetates, acrylic acid, or methacrylic acid and tetrafluoroethylene.

17. The transfer material of claim 13 wherein the cover layer contains less than or equal to 80% by weight of a polymer having a tensile strength greater than or equal to 2 N/mm$^2$.

18. The transfer material of claim 15 wherein the inert particles are present in the amount of 0.5–5000 particles/mm$^2$.

19. The transfer material of claim 15 wherein the inert particles have a diameter of less than or equal to 15 microns.

20. The process of claim 7 wherein the copolymers of unsaturated hydrocarbon are ethylene and propylene.

21. The process of claim 10 wherein the polymer is selected from the group consisting of homopolymers and copolymers of ethylene, propylene, vinyl esters, vinyl chloride, acrylates, methacrylates, acrylamides, methacrylamides, cellulose, copolymers of vinyl acetate, ethylene and polymethyl methacrylates or polystyrenes.

22. The process of claim 9 wherein the finely divided powder is selected from the group consisting of inorganic and organic pigments, fluorescence material, metal powders in pure form or together with a powdered organic or inorganic support, such as titanium oxide, glass powder, carbon, metal powders of aluminum, copper, iron, gold, silver, or metallic oxides.

23. The transfer material of claim 16 wherein the copolymers of unsaturated hydrocarbons are ethylene and propylene.

24. The transfer material of claim 17 wherein the polymer is selected from the group consisting of homopolymers and copolymers of ethylene, propylene, vinyl esters, vinyl chloride, acrylates, methacrylates, acrylamides, methacrylamides, cellulose, copolymers of vinyl acetate, ethylene and polymethyl methacrylates or polystyrenes.

25. The transfer material of claim 13 wherein the finely divided powder is selected from the group consisting of inorganic and organic pigments, fluorescence material, metal powders in pure form or together with a powdered organic or inorganic support, such as titanium oxide, glass powder, carbon, metal powders of aluminum, copper, iron, gold, silver, or metallic oxides.

* * * * *